(12) United States Patent
Jung et al.

(10) Patent No.: US 8,546,256 B2
(45) Date of Patent: Oct. 1, 2013

(54) METHOD OF FORMING SEMICONDUCTOR DEVICE

(75) Inventors: Deok-young Jung, Seoul (KR);
Gil-heyun Choi, Seoul (KR); Suk-chul Bang, Yongin-si (KR); Byung-lyul Park, Seoul (KR); Kwang-jin Moon, Suwon-si (KR); Dong-chan Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 273 days.

(21) Appl. No.: 13/167,225

(22) Filed: Jun. 23, 2011

(65) Prior Publication Data

US 2011/0318922 A1      Dec. 29, 2011

(30) Foreign Application Priority Data

Jun. 23, 2010   (KR) .................... 10-2010-0059700

(51) Int. Cl.
*H01L 21/283*          (2006.01)
(52) U.S. Cl.
USPC .................................. 438/667; 257/E21.159
(58) Field of Classification Search
USPC .................................. 438/667; 257/E21.159
See application file for complete search history.

(56) References Cited

U.S. PATENT DOCUMENTS

| | | | |
|---|---|---|---|
| 2002/0029818 A1* | 3/2002 | Murayama et al. | 141/65 |
| 2004/0018748 A1* | 1/2004 | Lu et al. | 438/778 |
| 2006/0292877 A1* | 12/2006 | Lake | 438/694 |
| 2007/0267754 A1* | 11/2007 | Kirby et al. | 257/774 |
| 2010/0173494 A1* | 7/2010 | Kobrin | 438/694 |
| 2011/0070679 A1* | 3/2011 | Borthakur et al. | 438/69 |

FOREIGN PATENT DOCUMENTS

| | | |
|---|---|---|
| JP | 2004-119593 A | 4/2004 |
| JP | 2007-311584 A | 11/2007 |
| KR | 2009-0076118 A | 7/2009 |

* cited by examiner

*Primary Examiner* — Alexander Ghyka
*Assistant Examiner* — Stanetta Isaac
(74) *Attorney, Agent, or Firm* — Harness, Dickey & Pierce

(57) ABSTRACT

The methods include forming a semiconductor substrate pattern by etching a semiconductor substrate. The semiconductor pattern has a first via hole that exposes side walls of the semiconductor substrate pattern, and the side walls of the semiconductor substrate pattern exposed by the first via hole have an impurity layer pattern. The methods further include treating upper surfaces of the semiconductor substrate pattern, the treated upper surfaces of the semiconductor substrate pattern being hydrophobic; removing the impurity layer pattern from the side walls of the semiconductor substrate pattern exposed by the first via hole; forming a first insulating layer pattern on the side walls of the semiconductor substrate pattern exposed by the first via hole; and filling a first conductive layer pattern into the first via hole and over the first insulating layer pattern.

20 Claims, 16 Drawing Sheets

METHOD OF FORMING SEMICONDUCTOR DEVICE

CROSS-REFERENCE TO RELATED APPLICATIONS

This application claims the benefit of priority under 35 U.S.C. §119(e) from Korean Patent Application No. 10-2010-0059700, filed on Jun. 23, 2010, in the Korean Intellectual Property Office, the disclosure of which is incorporated herein in its entirety by reference.

BACKGROUND

1. Field

Example embodiments of the inventive concepts relate to methods of forming a semiconductor device, and more particularly, to methods of manufacturing a semiconductor device including a through silicon via hole.

2. Related Art

When semiconductor devices have higher integration, minute defects of elements constituting the semiconductor device affect the performance of the semiconductor device.

In order to ensure the quality competitiveness of a semiconductor device, efforts are being made to reduce manufacturing costs of the semiconductor device. For example, in a process for forming a through silicon via hole formed in a wafer level package, efforts are being made to reduce manufacturing costs.

SUMMARY

Example embodiments of the inventive concepts relate to methods of forming a semiconductor device, and more particularly, to methods of manufacturing a semiconductor device including a through silicon via hole.

Example embodiments of the inventive concepts provide a method of manufacturing a semiconductor device including a through silicon via hole that does not have a void.

According to an example embodiment of the inventive concepts, there is provided a method of manufacturing a semiconductor device. The method comprises forming an interlayer insulating layer on a semiconductor substrate; forming an insulating interlayer pattern and a semiconductor substrate pattern by sequentially etching the interlayer insulating layer and the semiconductor substrate, the insulating interlayer pattern and the semiconductor substrate pattern having a via hole exposing side walls of the insulating interlayer pattern and side walls of the semiconductor substrate pattern, and the side walls of the semiconductor substrate pattern exposed by the via hole having an impurity layer pattern; treating an upper surface and the side walls of the insulating interlayer pattern exposed by the via hole, the treated upper surface and side walls of the insulating interlayer pattern being hydrophobic; removing the impurity layer pattern from the side walls of the semiconductor substrate pattern exposed by the via hole; forming a first insulating layer pattern on the side walls of the semiconductor substrate pattern and the hydrophobic side walls of the insulating interlayer pattern exposed by the via hole; and filling a conductive layer pattern into the via hole and over the first insulating layer pattern.

The etching of the semiconductor substrate may comprise performing dry-etching on the semiconductor substrate to form the via hole, wherein the semiconductor substrate is a silicon substrate. The dry-etching of the silicon substrate may comprise forming a sub-via hole exposing side walls of the silicon substrate by etching the silicon substrate using a first gas comprising fluorine; forming a passivation layer pattern on the side walls of the silicon substrate exposed by the sub-via hole using a second gas comprising carbon; and repeatedly performing the forming of a sub-via hole and the forming of the passivation layer pattern to form the via hole. The first gas may comprise at least one of $SiF_4$ and $SF_6$, and the second gas may comprise at least one of $C_4F_8$ and $C_4F_6$.

The treating and the removing collectively may comprise dipping a structure comprising the insulating interlayer pattern, the semiconductor substrate pattern, and the impurity layer pattern into a first solution, before the forming of the first insulating layer pattern. The first solution may comprise HF and deionized water at a ratio of 1:50 through 1:1000. The first solution may comprise HF, $H_2SO_4$, $H_2O_2$, and deionized water. The first solution may comprise $NH_4OH$, $H_2O_2$, and deionized water.

The impurity layer pattern may comprise a polymer layer pattern comprising carbon.

The forming of the first insulating layer pattern may comprise forming a silicon oxide layer pattern.

According to another example embodiment of the inventive concepts, there is provided a method of manufacturing a semiconductor device. The method comprises forming a semiconductor substrate pattern by etching a semiconductor substrate, the semiconductor substrate pattern having first via hole exposing side walls of the semiconductor substrate pattern, and the side walls of the semiconductor substrate pattern exposed by the first via hole having an impurity layer pattern; treating upper surfaces of the semiconductor substrate pattern, the treated upper surfaces of the semiconductor pattern being hydrophobic; removing the impurity layer pattern from the side walls of the semiconductor substrate pattern exposed by the first via hole; forming a first insulating layer pattern on the side walls of the semiconductor substrate pattern exposed by the first via hole; and filling a first conductive layer pattern into the first via hole and over the first insulating layer pattern.

The etching of the semiconductor substrate may comprise performing dry-etching on the semiconductor substrate to form the first via hole, wherein the semiconductor substrate is a silicon substrate. The dry-etching of the silicon substrate may comprise forming a first sub-via hole exposing side walls of the silicon substrate by etching the silicon substrate by using a first gas comprising fluorine; forming a passivation layer pattern on the side walls of the silicon substrate exposed by the first sub-via hole using a second gas comprising carbon; and repeatedly performing the forming of a first sub-via and the forming of the passivation layer pattern to form the first via hole.

The treating and the removing collectively may comprise dipping a structure comprising the semiconductor substrate pattern and the impurity layer pattern into a first solution, before the forming of the first insulating layer pattern.

The method may further comprise, after the filling of the first conductive layer pattern into the first via hole, forming an insulating interlayer pattern having a second via hole connected to the first via hole on the semiconductor substrate pattern, wherein the second via hole exposes side walls the insulating interlayer pattern; treating upper surfaces of the insulating interlayer pattern, the treated upper surfaces of the insulating interlayer pattern being hydrophobic; and filling a second conductive layer pattern into the second via hole.

The treating of the upper surfaces of the insulating interlayer pattern may comprise dipping a structure including the insulating interlayer pattern into the first solution before the filling of the second conductive layer pattern into the second via hole.

According to yet another example embodiment, there is provided a method of manufacturing a semiconductor device. The method includes etching a semiconductor substrate to form a semiconductor substrate pattern having a via hole exposing side walls of the semiconductor substrate pattern, and the side walls of the semiconductor substrate pattern exposed by the via hole having an impurity layer. The method further includes attaching a hydrophobic moiety to upper surfaces of the semiconductor substrate pattern; removing the impurity layer from the side walls of the semiconductor substrate pattern exposed by the via hole; forming an insulating layer on the side walls of the semiconductor substrate pattern; and forming a conductive layer in the via hole and over the insulating layer.

The attaching of the hydrophobic moiety and the removing of the impurity layer pattern, collectively, may include exposing a structure including the semiconductor substrate pattern and the impurity layer into a solution including the hydrophobic moiety, before the forming of the insulating layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
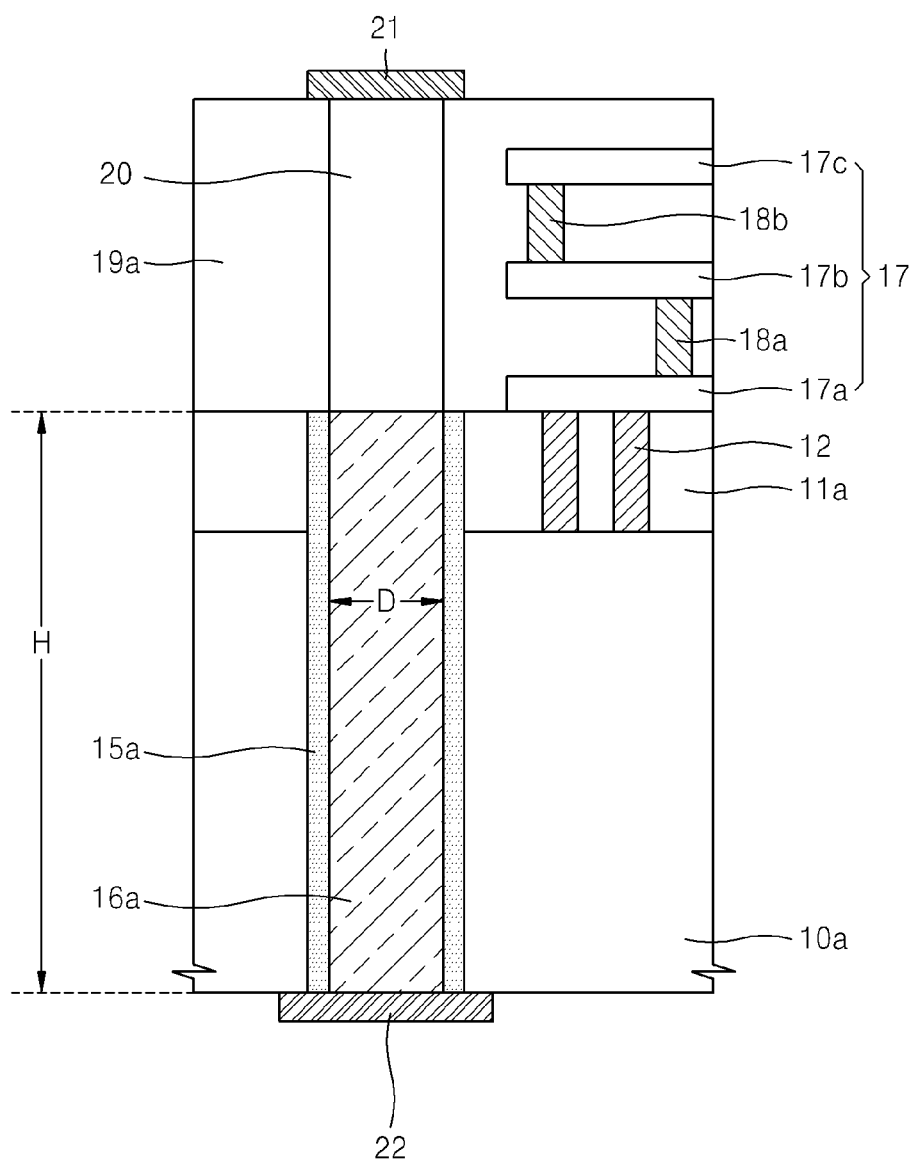
FIG. 1 is a partial cross-sectional view illustrating a semiconductor device, according to an example embodiment of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments of the inventive concepts relate to methods of manufacturing a semiconductor device, and more particularly, to methods of manufacturing a semiconductor device including a through silicon via hole.

FIG. 1 is a partial cross-sectional view illustrating a semiconductor device, according to an example embodiment of the inventive concepts.

Referring to FIG. 1, an insulating interlayer pattern 11a is formed on a semiconductor substrate pattern 10a.

The semiconductor substrate pattern 10a may be a substrate pattern formed of silicon. The insulating interlayer pattern 11a may be formed of at least one layer selected from the group consisting of a silicon oxide layer, a silicon nitride layer, and a silicon oxynitride layer. Accordingly, the insulating interlayer pattern 11a may be a stacked structure having at least one pattern selected from the group consisting of a silicon oxide layer pattern, a silicon nitride layer pattern, and a silicon oxynitride layer pattern.

Although it is not shown in FIG. 1, a gate structure, a word line structure, a bit line structure, and/or a capacitor structure of the semiconductor device may be buried in the insulating interlayer pattern 11a. In addition, metal wiring contacts 12 are buried in the insulating interlayer pattern 11a. Metal wiring contacts 12 may be connected to a first metal wiring pattern 17a formed on the insulating interlayer pattern 11a and may extend to the semiconductor substrate pattern 10a. In FIG. 1, the metal wiring contacts 12 extend to the semiconductor substrate pattern 10a, but may extend to the gate structure, the word line structure, the bit line structure, and/or the capacitor structure that may be buried in the insulating interlayer pattern 11a when necessary.

A through silicon via (TSV) hole may be formed in each of the semiconductor substrate pattern 10a and the insulating interlayer pattern 11a. (A first insulating layer pattern 15a and a conductive layer pattern 16a may be formed in the TSV hole.)

The first insulating layer pattern 15a may prevent current from leaking between the conductive layer pattern 16a and the semiconductor substrate pattern 10a and between the conductive layer pattern 16a and the insulating interlayer pattern 11a. The first insulating layer pattern 15a may be formed of a silicon oxide layer pattern or a silicon nitride layer pattern. Hereinafter, it will be described that the first insulating layer pattern 15a is formed of a silicon oxide layer pattern. However, example embodiments are not limited thereto.

The conductive layer pattern 16a may fill the TSV hole and function as a pattern for an electrical connection. The conductive layer pattern 16a may include a metal having a high electrical conductivity, for example, copper.

For example, a diameter D of the TSV hole may be such that the TSV hole having a height H of about 1 μm to about 200 μm has a cross-sectional area of about 1 μm² to about 3000 μm².

Meanwhile, an inter-metal wiring insulating layer pattern 19a in which first through third metal wiring patterns 17a, 17b, and 17c and inter-metal wiring contacts 18a and 18b are buried is formed on the insulating interlayer pattern 11a, the first insulating layer pattern 15a, and the conductive layer pattern 16a. A via contact pattern 20 is formed in the inter-metal wiring insulating layer pattern 19a so as to correspond to the conductive layer pattern 16a. The via contact pattern 20 may be formed of a conductive material, for example, copper. A first conductive pad 21 is formed on the via contact pattern 20, and a second conductive pad 22 is formed under the conductive layer pattern 16a.

FIGS. 2 through 12 are cross-sectional views sequentially illustrating a process for manufacturing the semiconductor device of FIG. 1, according to an example embodiment of the inventive concepts.

Figure 2:
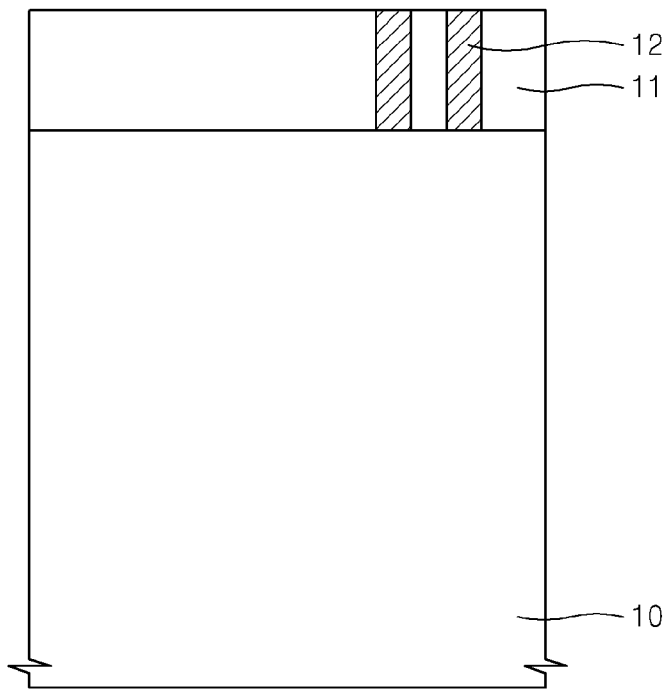
FIGS. 2 through 12 are cross-sectional views sequentially illustrating a process for manufacturing the semiconductor device of FIG. 1, according to an example embodiment of the inventive concepts.

Referring to FIG. 2, an interlayer insulating layer 11 is formed on a semiconductor substrate 10.

For example, the semiconductor substrate 10 may be a silicon substrate. The interlayer insulating layer 11 may be formed to have a single-layered structure including at least one layer selected from the group consisting of a silicon oxide layer, a silicon nitride layer, and a silicon oxynitride layer or may be formed to have a multiple-layered structure including a combination thereof.

Although it is not shown in the drawings, a gate structure, a word line structure, a bit line structure, and/or a capacitor structure of a semiconductor device may be buried in the interlayer insulating layer 11. Metal wiring contacts 12 may also be buried in the interlayer insulating layer 11.

Figure 3:
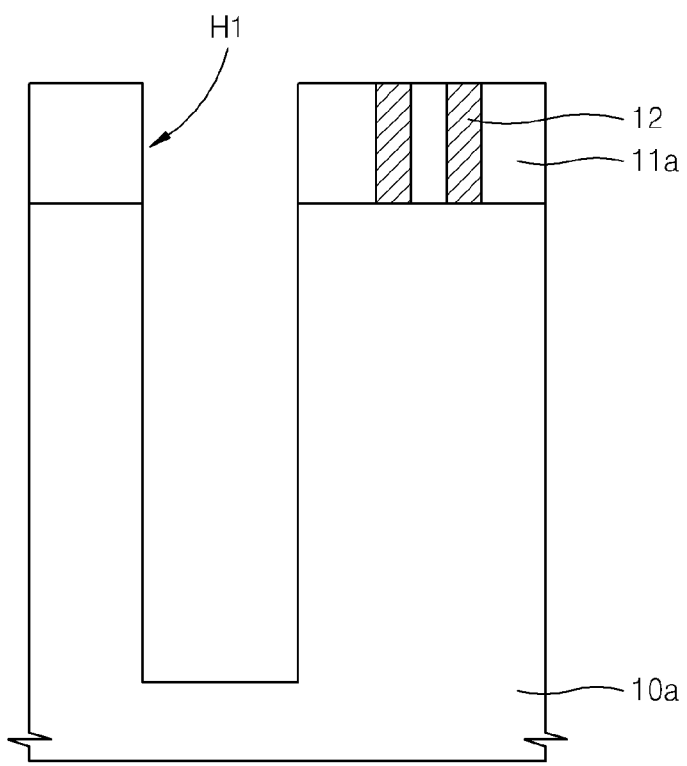

Referring to FIG. 3, a first via hole H1 is formed by etching the interlayer insulating layer 11 and the semiconductor substrate 10, thereby forming the insulating interlayer pattern 11a and the semiconductor substrate pattern 10a. Although not shown, at this time, the first via hole H1 may be formed to penetrate a bottom surface of the semiconductor substrate pattern 10a. When the semiconductor substrate 10 is a silicon substrate, an etching process for forming the first via hole H1 may include dry etching silicon.

Even though side walls of the first via hole H1 are flat in FIG. 3, if the dry etching of silicon is performed, the side walls of the first via hole H1 may not be flat.

The dry etching of silicon may include forming a plurality of sub-via holes and a plurality of passivation layer patterns in a vertical direction of the semiconductor substrate 10 by sequentially, or simultaneously, repeatedly performing the forming of a sub-via hole by using a first gas including fluorine and the forming of a passivation layer pattern on side walls of a sub-via hole by using a second gas including carbon.

Figure 4:
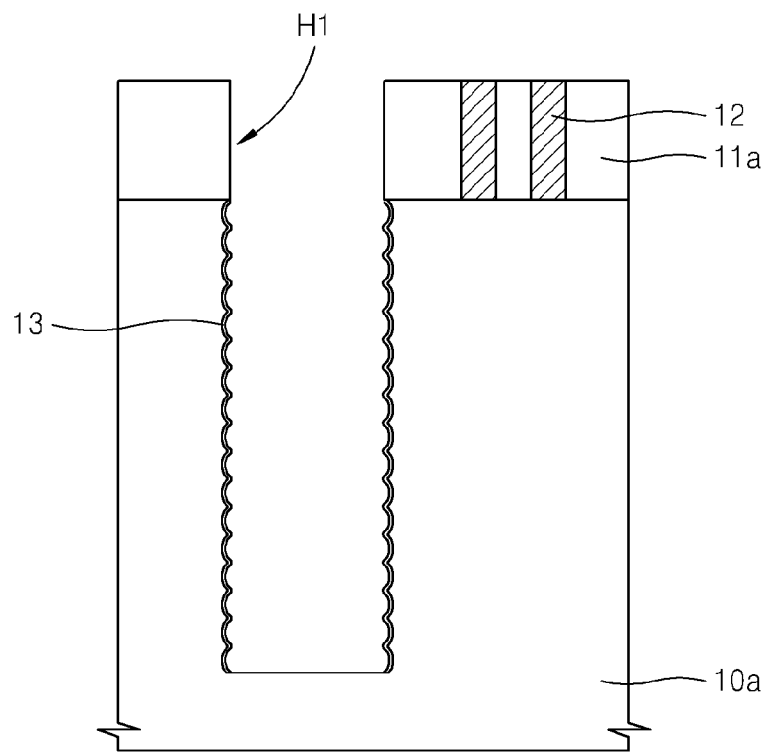
Figure 5:
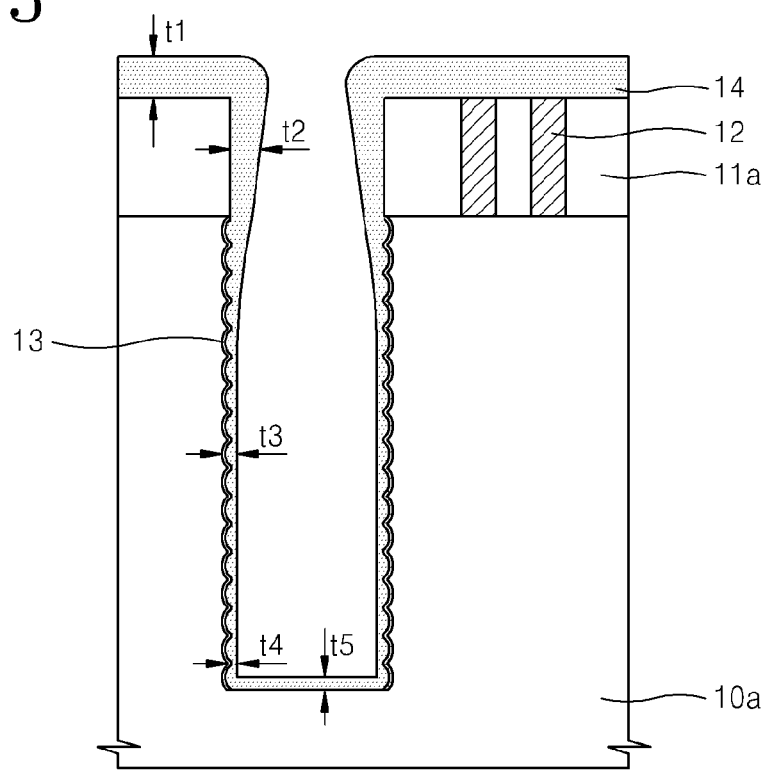

FIG. 4 is a partial cross-sectional view illustrating the semiconductor device including the first via hole after the dry etching of silicon is performed. FIG. 5 is a partial cross-sectional view illustrating the semiconductor device in which a first insulating layer pattern is formed in the first via hole right after the dry etching of silicon is performed.

Referring to FIG. 4, when a first via hole H1 is formed by performing the dry-etching of silicon on the semiconductor substrate 10, the side walls of the first via hole H1 are covered by impurity layer patterns 13 each having an uneven surface. The impurity layer patterns 13 may include a polymer material including carbon.

Figure 21:
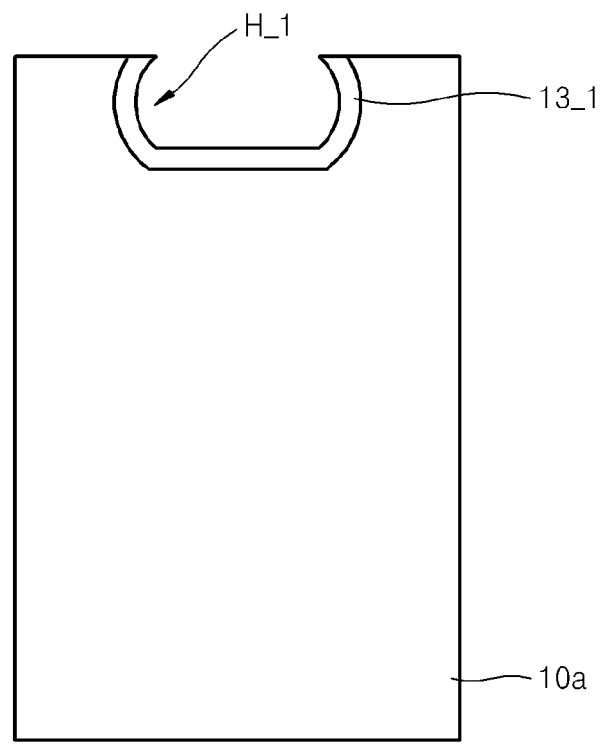
FIGS. 21 through 23 are enlarged cross-sectional views sequentially illustrating a process for forming a via hole by etching silicon, according to an example embodiment of the inventive concepts.
Figure 22:
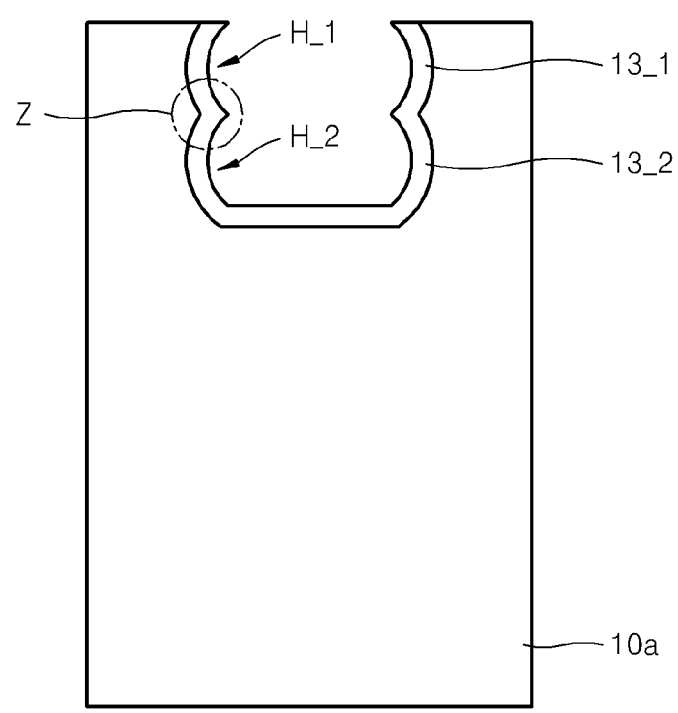
Figure 23:
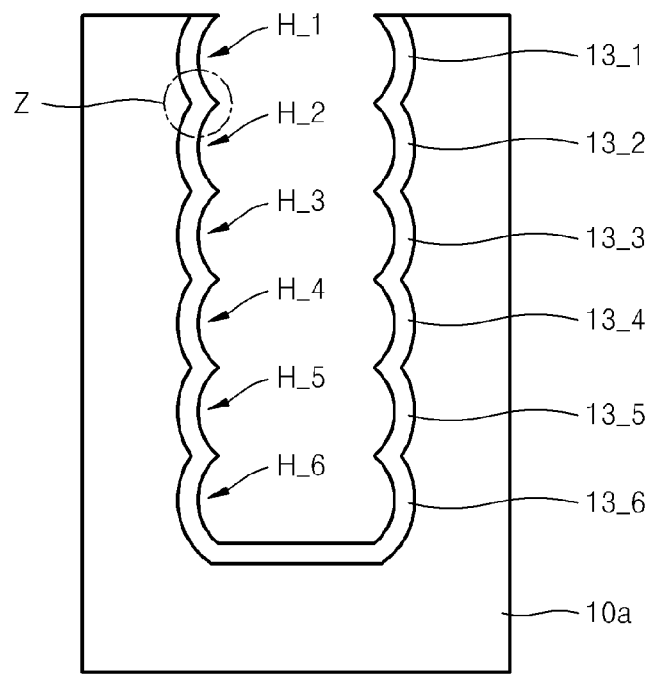

FIGS. 21 through 23 are enlarged cross-sectional views sequentially illustrating a process for forming the first via hole.

Referring to FIG. 21, a first sub-via hole H_1 is formed by performing dry etching on a part of the semiconductor substrate 10. The dry etching may include forming the first sub-via hole H_1 by etching the semiconductor substrate 10 using a first gas including fluorine, and forming a first passivation layer pattern 13_1 on side walls of the first sub-via hole H_1 by using a second gas including carbon.

Hereinafter, the first gas may include at least one selected from the group consisting of $SiF_4$ and $SF_6$, and the second gas may include at least one selected from the group consisting of $C_4F_8$ and $C_4F_6$.

The forming of the first sub-via hole H_1 and the forming of the first passivation layer pattern 13_1 may be performed sequentially in the order stated or in the reverse order, or may be performed simultaneously.

The first passivation layer pattern 13_1 formed on the side walls of the first sub-via hole H_1 may enable deep etching of the semiconductor substrate 10 at a constant width because ions used in the dry etching allow an etching process to be performed only in the vertical direction (a height direction of the sub-via hole H1) of the semiconductor substrate 10. The first passivation layer pattern 13_1 formed on the side walls of the first sub-via hole H_1 may prevent the semiconductor substrate 10 from being etched in the horizontal direction. The first passivation layer pattern 13_1 may be formed by using $C_4F_8$ as the second gas including carbon. However, $C_4F_8$, which is a perfluoro-compound (PFC) material, may be environmentally harmful due to having a long lifespan in air and contributes a relatively great amount to global warming. Thus, a $C_4F_6$ gas having a short lifespan in air and contributing a smaller amount to global warming may be used.

The first passivation layer pattern 13_1 is formed on the side walls of the first sub-via hole H1, and may further be formed on a bottom surface of the first sub-via hole H1.

Referring to FIG. 22, after the first sub-via hole H_1 is formed, a second sub-via hole H_2 may be formed by dry etching the bottom surface of the first sub-via hole H_1 of the semiconductor substrate 10 by using the first gas including fluorine and forming a second passivation layer pattern 13_2 on side walls of the second sub-via hole H_2 by using the second gas including carbon.

Similarly to the forming of the first sub-via hole H1, when the second sub-via hole H_2 is formed, the forming of the second sub-via hole H_2 and the forming of the second passivation layer pattern 13_2 may be performed sequentially in the order stated or in the reverse order, or may be performed simultaneously.

The second passivation layer pattern 13_2 formed on side walls of the second sub-via hole H_2 may enable deep etching of the semiconductor substrate 10 at a constant width because ions used in the dry etching allow an etching process to be performed only in the vertical direction (a height direction of the sub-via hole H_2) of the semiconductor substrate 10. The first passivation layer pattern 13_2 formed on the side walls of the first sub-via hole H_2 may prevent the semiconductor substrate 10 from being etched in the horizontal direction. Meanwhile, in the process for forming the second sub-via hole H_2, the first passivation layer pattern 13_1 formed on the bottom surface of the first sub-via hole H_1 is etched, and consequently, the first passivation layer pattern 13_1 remains only on the side walls of the first sub-via hole H1.

Meanwhile, the first passivation layer pattern 13_1 and the second passivation layer pattern 13_2 are polymer layer patterns including carbon, and thus the concentration of carbon is relatively great at a portion Z (see FIG. 22), that is, at a junction between the first passivation layer pattern 13_1 and the second passivation layer pattern 13_2.

Referring to FIG. 23, third through sixth sub-via holes H_3 to H_6 are then formed by repeatedly performing the above-described process for forming the second sub-via hole H_2, and thus six sub-via holes are formed. A through silicon via hole, for example, the first via hole H1 of FIG. 4, is formed by stacking a plurality of sub-via holes. In general, if one sub-via hole in a silicon substrate has a depth of about 200 nm, several hundreds of sub-via holes should be formed in order to form a through silicon via hole, for example, the first via hole H1 of FIG. 4.

Accordingly, several hundreds of passivation layer patterns, for example, the impurity layer patterns 13, are formed on side walls of a through silicon via hole formed by stacking several hundreds of sub-via holes, for example, the first via hole H1.

As described above with reference to FIG. 22, the concentration of carbon is relatively great at the portion Z (see FIG. 22), that is, at the junction between the first passivation layer pattern 13_1 and the second passivation layer pattern 13_2. Similarly, the concentrations of carbon are relatively great at a junction between the second passivation layer pattern 13_2 and a third passivation layer pattern 13_3, at a junction between the third passivation layer pattern 13_3 and a fourth passivation layer pattern 13_4, at a junction between the fourth passivation layer pattern 13_4 and a fifth passivation layer pattern 13_5, and at a junction between the fifth passivation layer pattern 13_5 and a sixth passivation layer pattern 13_6.

When the first insulating layer 14 (see FIG. 5) is formed on the impurity layer patterns 13, in particularly, formed through a deposition process, the first insulating layer 14 grows slowly at a portion where the concentration of carbon is great, while the first insulating layer 14 grows rapidly at a portion where the concentration of carbon is relatively low. Accordingly, the first insulating layer 14 formed on the impurity layer patterns 13 has an uneven surface, and the morphology of the surface is bad.

Thus, the impurity layer patterns 13 are necessary in a process for forming a deeply-etched silicon via hole having a constant width. However, when an insulating layer pattern is additionally formed after the formation of the through silicon via hole is completed, the impurity layer patterns 13 may be impurity layer patterns causing bad effects on the first insulating layer 14.

Referring to FIG. 5, the first insulating layer 14 is formed on the structure including the first via hole H1. The first insulating layer 14 may be a silicon oxide layer. When the first insulating layer 14 is deposited on the structure, a thickness of the first insulating layer 14 gradually decreases from an upper surface t1 of a portion of the insulating interlayer pattern 11a near the first via hole H1 towards side walls t2 of an upper portion of the first via hole H1, side walls t3 of a center portion of the first via hole H1, and side walls t4 of a lower portion of the first via hole H1. In addition, upper edge portions of the first insulating layer 14 are overhung from edges of the first via hole H1, thereby reducing a size of an entrance of the first via hole H1. Thus, when the first via hole H1 is to be filled with a conductive material in a later process, a void is more likely to be generated.

Figure 6:
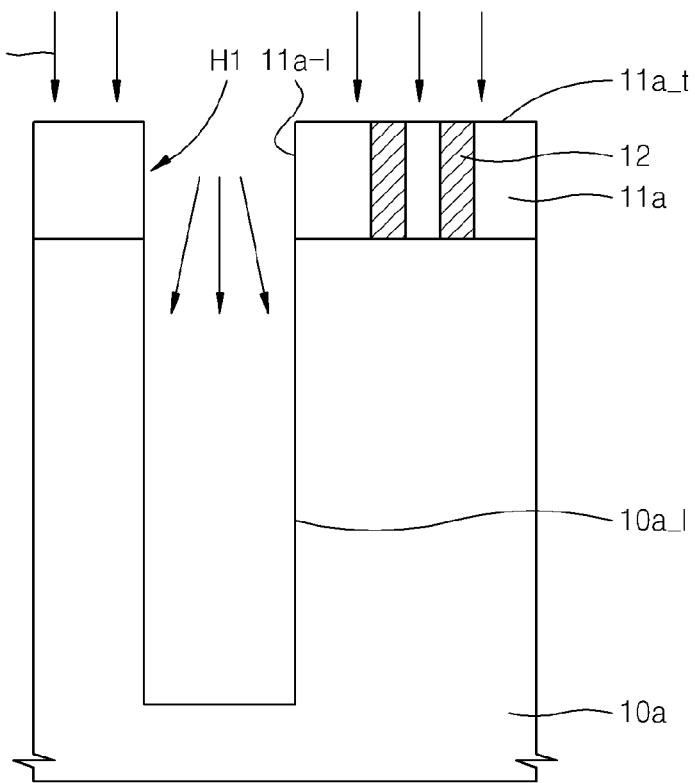

Referring to FIG. 6, a preprocess for uniformly depositing the first insulating layer 14 all over the first via hole H1 and improving the morphology of the surface of the first insulating layer 14 is performed.

The preprocess may include dipping the structure of FIG. 4 including the semiconductor substrate pattern 10a, the insulating interlayer pattern 11a, the impurity layer patterns 13, and the first via hole H1 into a first solution S.

The first solution S may comprise HF and deionized water at a ratio of 1:50 to 1:1000. In this case, a temperature of the first solution S may be about 25° C.

The first solution S may instead comprise $H_2SO_4$, $H_2O_2$ and deionized water at a ratio of 10:4:86. The first solution S may further comprise HF with 150 to 300 ppm. In this case, a temperature of the first solution S may be about 25° C.

The first solution S may instead comprise $NH_4OH$, $H_2O_2$, and deionized water at a ratio of 1:1:5. In this case, a temperature of the first solution S may be from about 40° C. to about 70° C.

When, for example, a cleaning process is performed using the first solution S on the structure shown in FIG. 4, the impurity layer patterns 13 formed on the side walls of the first via hole H1 may be removed. Accordingly, when the first insulating layer 14 is formed on the side walls of the first via hole H1 after performing the cleaning process using the first solution S, the morphology of the surface of the first insulating layer 14 may be satisfactory.

Meanwhile, when, for example, a cleaning process is performed using the first solution S, exposed surfaces of the insulating interlayer pattern 11a changes from hydrophilic to hydrophobic. That is, an upper surface 11a_t of the insulating interlayer pattern 11a and a side surface 11a 1 of the insulating interlayer pattern 11a exposed by the first via hole H1 change from hydrophilic to hydrophobic.

Figure 24:
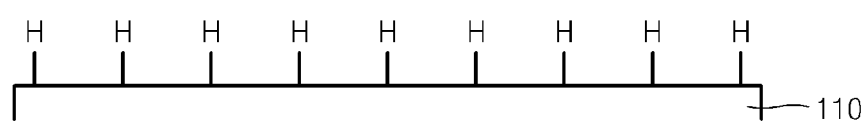
FIG. 24 is a conceptual diagram illustrating a surface atom coupling state when a surface is hydrophobic, according to an example embodiment of the inventive concepts.
Figure 25:
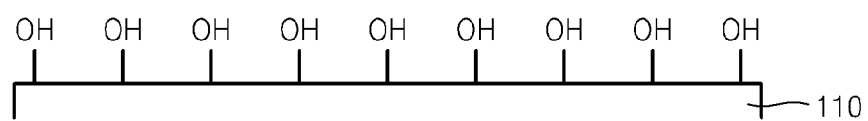
FIG. 25 is a conceptual diagram illustrating a surface atom coupling state when a surface is hydrophilic, according to an example embodiment of the inventive concepts.

FIG. 24 is a conceptual diagram illustrating a surface atom coupling state when the exposed surfaces of the insulating interlayer pattern are hydrophobic. FIG. 25 is a conceptual diagram illustrating a surface atom coupling state when the exposed surfaces of the insulating interlayer pattern are hydrophilic.

Referring to FIG. 24, when —H radicals are exposed on a surface of an arbitrary layer 110, the surface of the arbitrary layer 110 has a hydrophobic property. Referring to FIG. 25, when —OH radicals are exposed on the surface of the arbitrary layer 110, the surface of the arbitrary layer 110 has a hydrophilic property. The surface moiety of the arbitrary layer 110 may be in a radical state or a non-radical state.

Referring back to FIG. 6 and FIG. 7, when the exposed surfaces of the insulating interlayer pattern 11a is hydrophobic, a rate at which a first insulating layer 15 is deposited on the insulating interlayer pattern 11a is decreased.

Therefore, when the rate at which the first insulating layer 15 is deposited on the insulating interlayer pattern 11a treated with the first solution S is relatively low, a portion of the first insulating layer 15 formed on the insulating interlayer pattern 11a is formed relatively thin.

This is more apparent at the upper portion of the first via hole H1 than at the lower portion thereof, due to the fact that a surface of the semiconductor substrate pattern 10a exposed by the first via hole H1 is covered by the impurity layer patterns 13 in the lower portion of the first via hole H1 and thus the first solution S is used to remove the impurity layer pattern 13 rather than to make the exposed surface of the semiconductor substrate pattern 10a hydrophobic.

Figure 7:
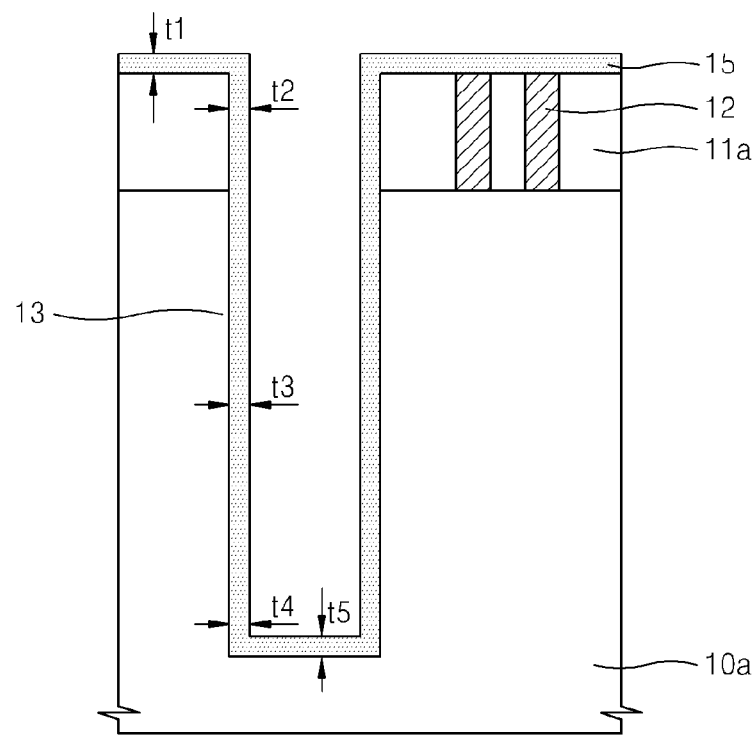

Referring to FIG. 7, when the first insulating layer 15 is deposited on the semiconductor substrate pattern 10a and the insulating interlayer pattern 11a having the first via hole H1 treated with the first solution S, the first insulating layer 15 is uniformly formed all over the first via hole H1. That is, when the first insulating layer 15 is deposited, the first insulating layer 15 is uniformly formed over the upper surface t1 of the portion of the insulating interlayer pattern 11a near the first via hole H1, the side walls t2 of the upper portion of the first via hole H1, the side walls t3 of the center portion of the first via hole H1, the side walls t4 of the lower portion of the first via hole H1, and a bottom surface t5 of the first via hole H1. In addition, when the exposed surfaces of the insulating interlayer pattern 11a are hydrophobic as described above, the rate at which the first insulating layer 15 is deposited on the insulating interlayer pattern 11a is relatively low, thereby reducing the thickness of the first insulating layer 15. Therefore, the first insulating layer 15 formed all over the first via hole H1 is uniformly formed. In addition, because the upper edge portions of the first insulating pattern 11a are not overhung, the size of the entrance of the first via hole H1 is not reduced. Thus, when the first via hole H1 is to be filled with a conductive material in a later process, a void may be less likely to be generated.

Figure 26:
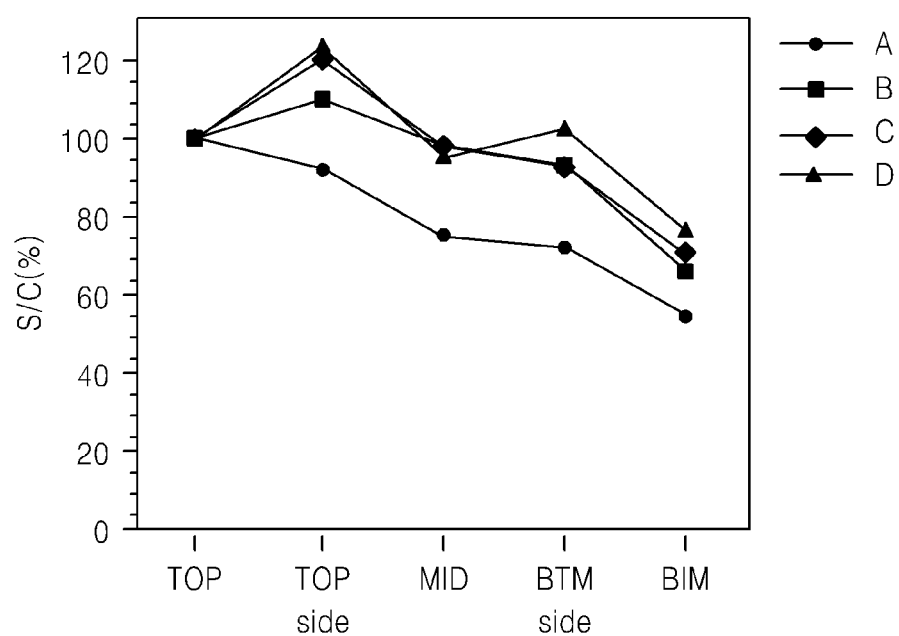
FIG. 26 is a graph illustrating step coverages of a layer deposited on a via hole according to different preprocesses, according to an example embodiment of the inventive concepts.

FIG. 26 is a graph illustrating step coverages of the first insulating layer deposited on a via hole according to different preprocesses performed on a substrate having the structure of FIG. 4, according to an example embodiment of the inventive concepts.

Referring to the graph of FIG. 26, the step coverages (S/C) of the first insulating layer 15 are expressed as percentages with respect to a case (A) where the first insulating layer 15 is formed in the structure of FIG. 4 without the structure having undergone any preprocess, a case (B) where a preprocess is performed by using a solution containing $NH_4OH$, $H_2O_2$, HF, and deionized water, a case (C) where a preprocess is performed by using a solution containing HF and deionized water for 30 seconds, and a case (D) where a preprocess is performed by using a solution containing HF and deionized water for 60 seconds.

Meanwhile, a horizontal axis (x-axis) of the graph represents a position where a thickness of the first insulating layer 15 is measured. The first insulating layer 15 is sequentially measured at an upper portion (TOP) of a periphery of the via hole, side walls (TOP side) of an upper portion of the via hole, side walls (MID) of a center portion of the via hole, side walls (BTM side) of a lower portion of the via hole, and a bottom surface (BTM) of the lower portion of the via hole in the order stated.

The step coverages of the first insulating layer 15 shown in the graph are percentages with respect to the thickness of the first insulating layer 15 formed on the upper portion (TOP) of the periphery of the via hole, and thus the step coverages are 100% in all the cases (A), (B), (C), and (D) with respect to the upper portion (TOP) of the periphery of the via hole.

The step coverage of the deposited first insulating layer 15 is poorest in the case (A) where a preprocess is not performed. While in the other cases (B), (C), and (D), the deposited first insulating layer 15 has step coverages that sequentially increase in the order of the case (B) where the preprocess is performed by using a solution containing $NH_4OH$, $H_2O_2$, HF, and deionized water, the case (C) where the preprocess is performed by using a solution containing HF and deionized water for 30 seconds, and the case (D) where the preprocess is performed by using a solution containing HF and deionized water for 60 seconds.

Thus, it can be seen that the step coverage of the first insulating layer 15 deposited on the via hole when any of the preprocesses using the solutions is performed may be increased.

Figure 8:
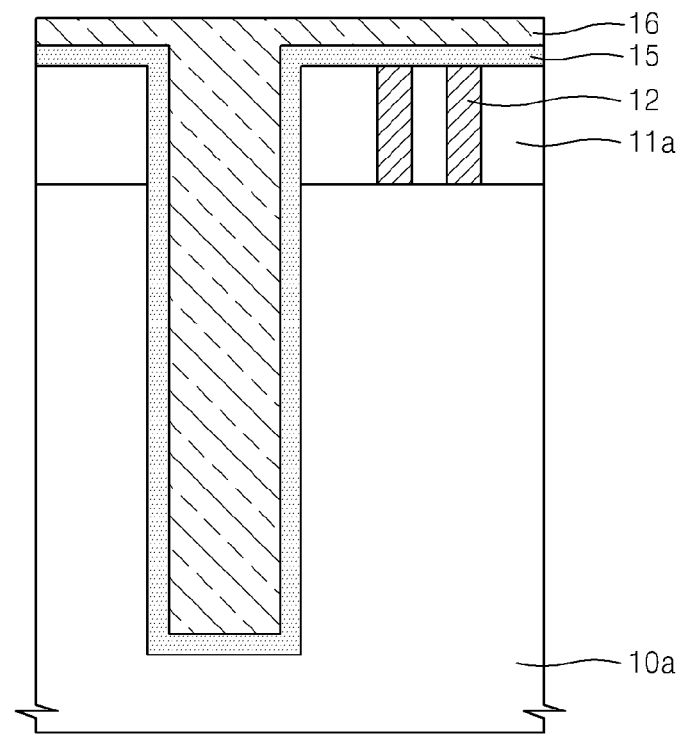

Referring to FIG. 8, a conductive layer 16 is filled into the first via hole H1 on which the first insulating layer 15 is deposited. The conductive layer 16 may be a copper layer and may be formed by using an electroplating method. In this case, a seed layer (not shown) may be first formed on the first insulating layer 15. The forming of the copper layer by using an electroplating method. Meanwhile, according to another example embodiment of the present invention, the conductive layer 16 may include any of various other metals or may be formed of a polysilicon.

Figure 9:
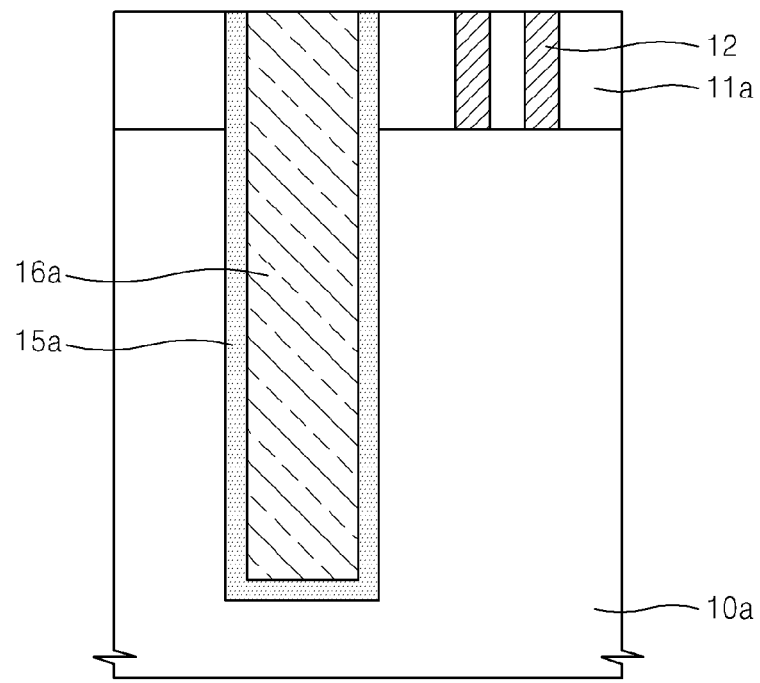

Referring to FIG. 9, the first insulating layer 15 and the conductive layer 16 are partially and evenly removed so as to expose the upper surface of the insulating interlayer pattern 11a, thereby forming the first insulating layer pattern 15a and the conductive layer pattern 16a. Thus, the conductive layer pattern 16a is insulated from the semiconductor substrate pattern 10a and the insulating interlayer pattern 11a by the first insulating layer pattern 15a.

Figure 10:
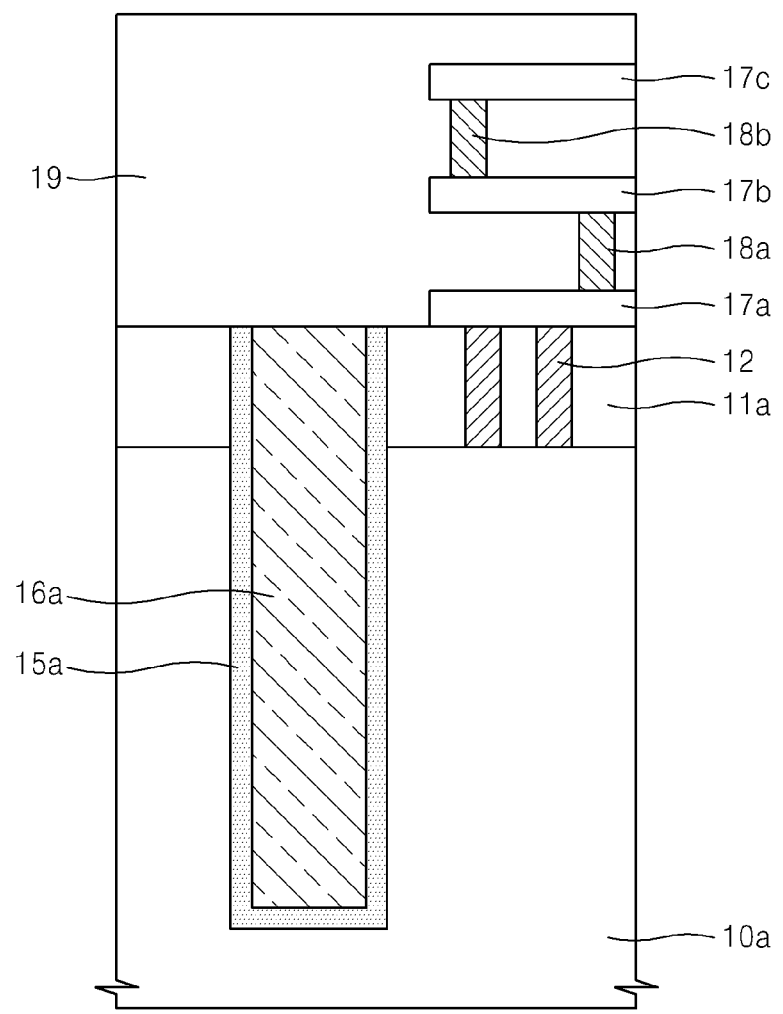

Referring to FIG. 10, an inter-metal wiring insulating layer pattern 19, in which the first through third metal wiring patterns 17a, 17b, and 17c and the inter-metal wiring contacts 18a and 18b are buried, is formed on the insulating interlayer pattern 11a, the first insulating layer pattern 15a, and the conductive layer pattern 16a. In FIG. 10, the first through third metal wiring patterns 17a, 17b, and 17c has a triple-layered structure, but there may be a multiple-layered structure having any of various numbers of layers. The metal wiring contacts 12 may be connected to the first layer metal wiring pattern 17a formed on the insulating interlayer pattern 11a.

Figure 11:
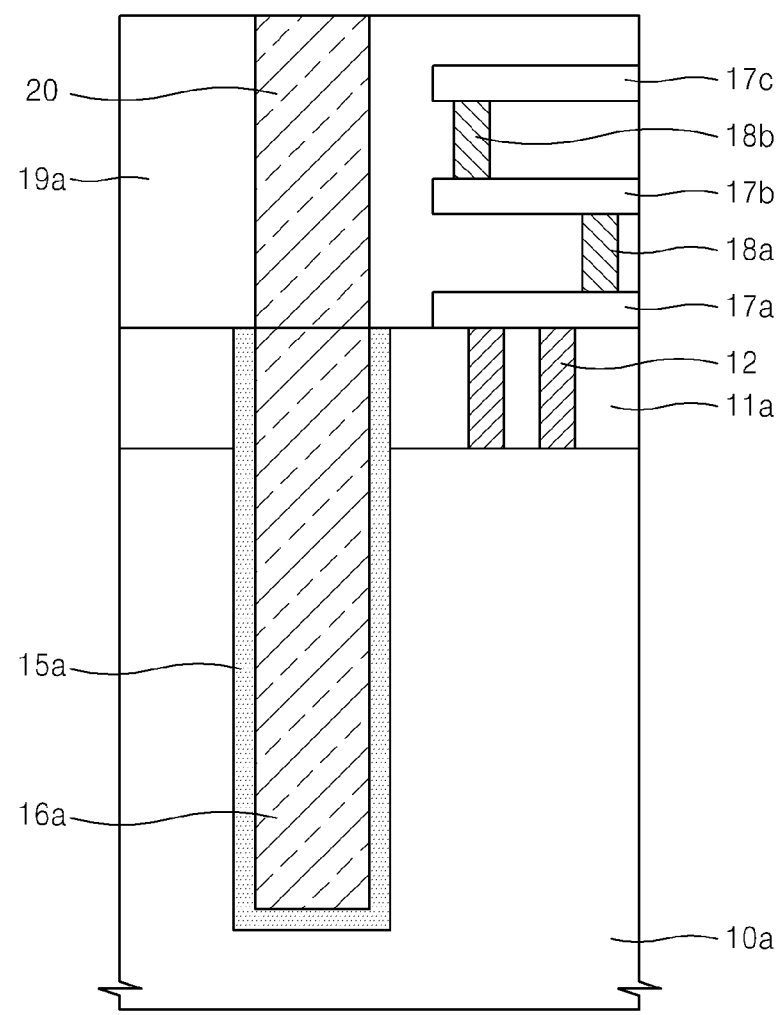

Referring to FIG. 11, a via hole is formed in the inter-metal wiring insulating layer 19 to form the inter-metal wiring insulating layer pattern 19a and the via contact pattern 20 is formed filling a conductive material into the via hole. The via contact pattern 20 is formed to be connected to the conductive layer pattern 16a. An insulating layer pattern (not shown) may further be interposed between the via contact pattern 20 and the inter-metal wiring insulating layer pattern 19a.

Figure 12:
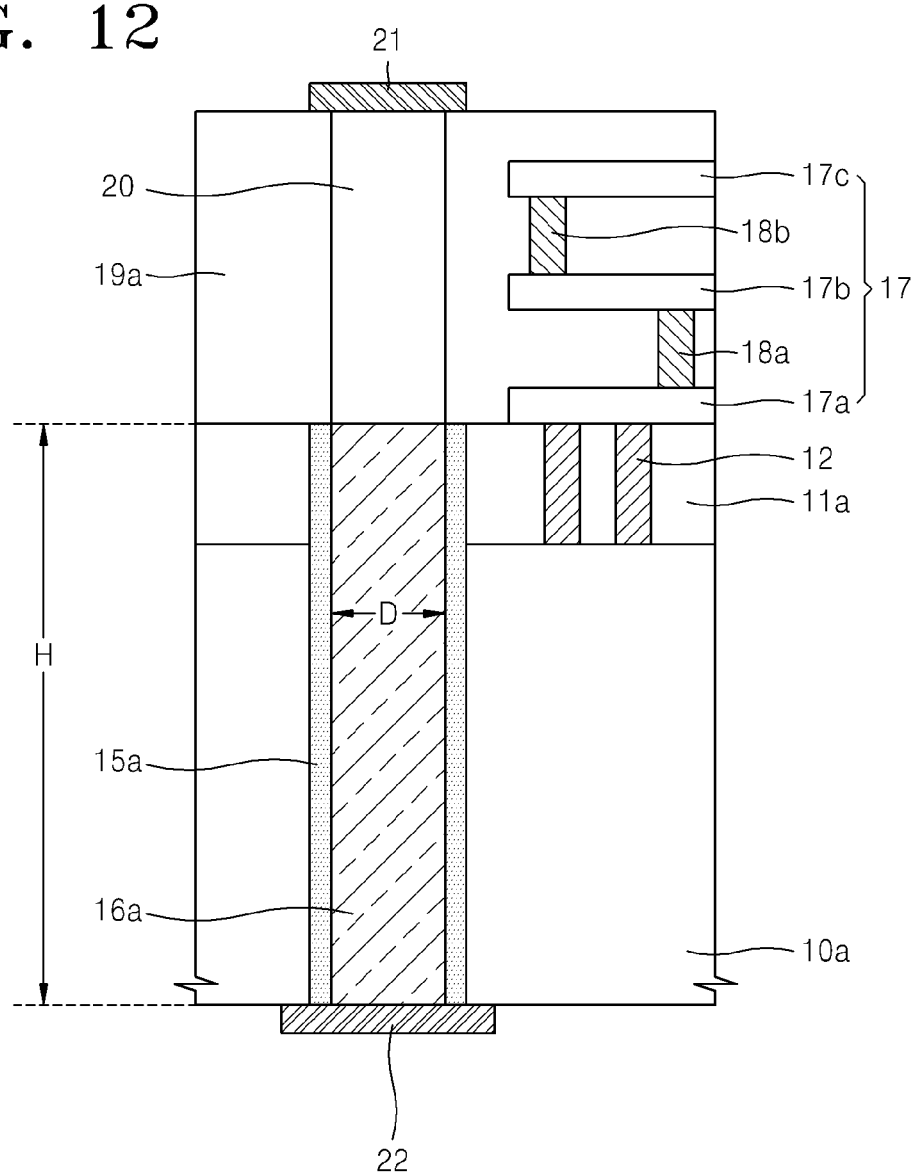

Referring to FIG. 12, a rear surface of the semiconductor substrate pattern 10a may be evenly removed so as to expose a bottom surface of the conductive layer pattern 16a by using a grinding process, a polishing process, an etching process, or the like.

The first electrode pad 21 may be formed on the via contact pattern 20, and the second electrode pad 22 may be formed under the conductive layer pattern 16a. The first electrode pad 21 and the second electrode pad 22 may be electrically connected to an external connector in a wafer level package.

FIGS. 13 through 20 are cross-sectional views sequentially illustrating a process for manufacturing the semiconductor device of FIG. 1, according to another example embodiment of the inventive concepts.

Unlike the embodiment described with reference to FIGS. 2 through 12, in the present example embodiment, a preprocess is performed using a first solution on a second via hole H2 formed in the semiconductor substrate pattern 10a before the insulating interlayer pattern 11a is formed on the semiconductor substrate pattern 10a, and then the first insulating layer pattern 15a and the conductive layer pattern 16a are formed in the second via hole H2. Then, a preprocess is performed using the first solution on a third via hole H3 formed in the insulating interlayer pattern 11a, and then a second insulating layer pattern 25a and a second conductive layer pattern 26a are formed in the third via hole H3.

Figure 13:
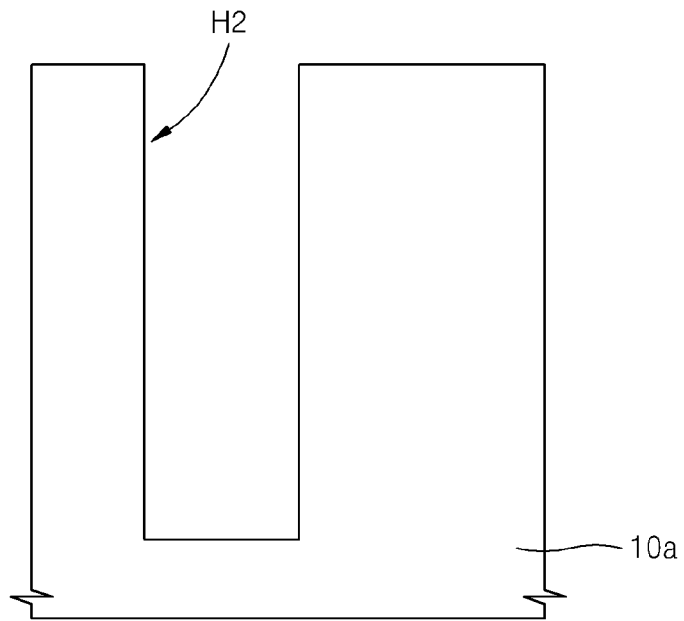
FIGS. 13 through 20 are cross-sectional views sequentially illustrating a process for manufacturing the semiconductor device of FIG. 1, according to another example embodiment of the inventive concepts.

Referring to FIG. 13, a second via hole H2 is formed in the semiconductor substrate pattern 10a. The second via hole H2 may be a part of a through silicon via hole used in a wafer level package.

At this time, the second via hole H2 may be formed to penetrate the bottom surface of the semiconductor substrate pattern 10a. However, in the current example embodiment, the second via hole H2 does not. When the semiconductor substrate 10 is a silicon substrate, an etching process for forming the second via hole H2 may include dry-etching of silicon.

Even though side walls of the second via hole H2 are flat in FIG. 13, if the dry-etching of silicon is performed, the side walls of the second via hole H2 may not be flat, and the impurity layer patterns 13 having a poor morphology may be formed on the side walls of the second via hole H2. The impurity layer patterns 13 may be formed of a polymer material including carbon.

The dry etching of silicon may include forming a plurality of sub-via holes and a plurality of passivation layer patterns in a vertical direction of the semiconductor substrate 10 by sequentially or simultaneously repeatedly performing the forming of a sub-via hole by using a first gas including fluorine and the forming of a passivation layer pattern on side walls of a sub-via hole by using a second gas including carbon. As in the previous example embodiments, the forming of the first sub-via hole H_1 and the forming of the first passivation layer pattern 13_1 may be performed sequentially in the order stated or in the reverse order, or may be performed simultaneously.

Figure 15:
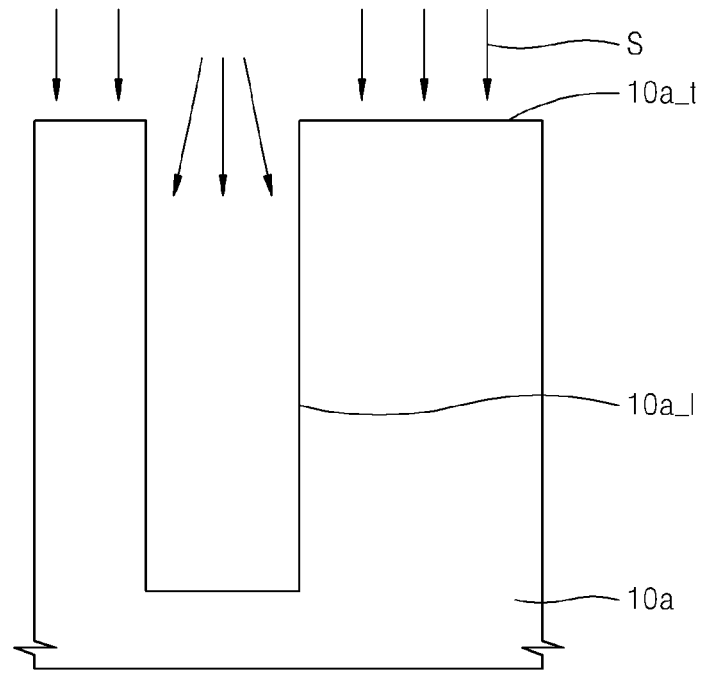

Referring to FIG. 15, a preprocess is performed on the semiconductor substrate pattern 10a including the second via hole H2.

Figure 14:
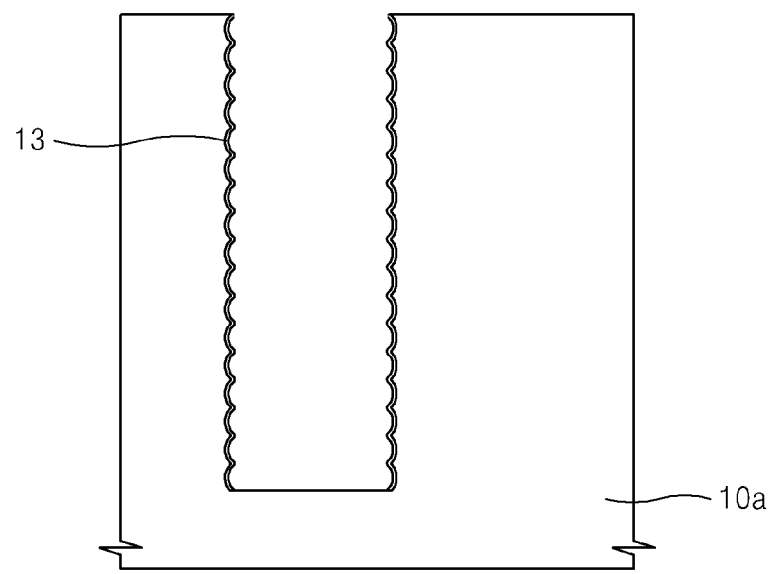

The preprocess may include dipping the structure of FIG. 14 including the semiconductor substrate pattern 10a, the impurity layer pattern 13, and the second via hole H2 into the first solution S.

The first solution S may comprise HF and deionized water at a ratio of 1:50 through 1:1000. In this case, a temperature of the first solution S may be about 25° C.

The first solution S may instead comprise $H_2SO_4$, $H_2O_2$, and deionized water at a ratio of 10:4:86. The first solution S may further comprise HF with 150 to 300 ppm. In this case, a temperature of the first solution S may be about 25° C.

The first solution S may contain $NH_4OH$, $H_2O_2$, and deionized water at a ratio of 1:1:5. In this case, a temperature of the first solution S may be from about 40° C. to about 70° C.

When, for example, a cleaning process is performed using the first solution S, the impurity layer patterns 13 formed on the side walls of the second via hole H2 are removed. Accordingly, when the first insulating layer 15 is formed on the side walls of the second via hole H2 after performing the cleaning process using the first solution S, the morphology of the surface of the first insulating layer 15 is satisfactory.

Meanwhile, when the cleaning process is performed using the first solution S, exposed surfaces of the semiconductor substrate pattern 10a may change from hydrophilic to hydrophobic. That is, an upper surface of the semiconductor substrate pattern 10a and side surfaces of the semiconductor substrate pattern 10a exposed by the second via hole H2 may change from hydrophilic to hydrophobic.

When the exposed surfaces of the semiconductor substrate pattern 10a are hydrophobic, the rate at which the first insulating layer 15 is deposited on the semiconductor substrate pattern 10a is relatively low, thereby a portion of the first insulating layer 15 formed on the semiconductor substrate pattern 10a is formed relatively thin. This is more apparent at an upper portion of the second via hole H2 than at a lower portion thereof, due to the fact that the second via hole H2 may be formed substantially deep and thus the contact area between the first solution S and the second via hole H2 is greater at the upper portion of the second via hole H2 than at the lower portion of the second via hole H2.

Figure 16:
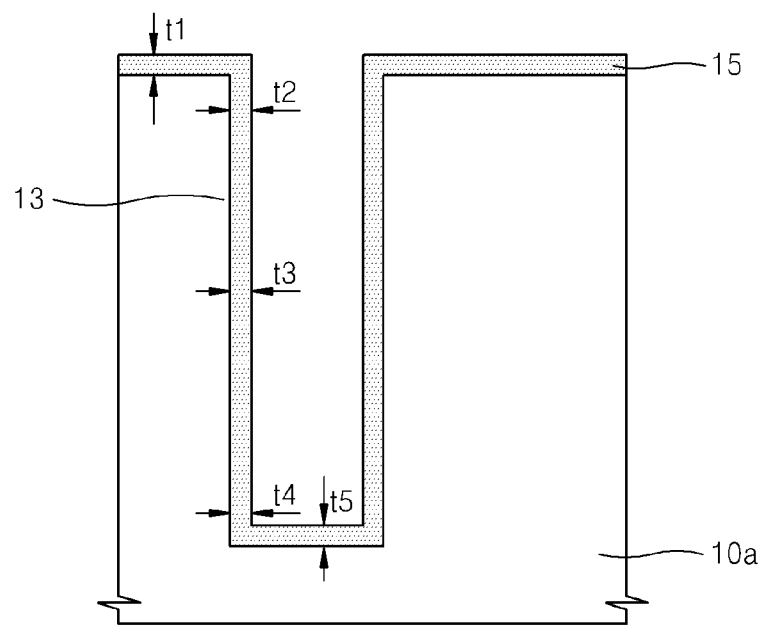

Referring to FIG. 16, when the first insulating layer 15 is deposited on the semiconductor substrate pattern 10a having the second via hole H2 treated with the first solution S, the first insulating layer 15 is uniformly formed all over the second via hole H2. That is, when the first insulating layer 15 is deposited, the first insulating layer 15 is uniformly formed over an upper surface t1 of a portion of the semiconductor substrate pattern 10a near the second via hole H2, side walls t2 of the upper portion of the second via hole H2, side walls t3 of a center portion of the second via hole H2, side walls t4 of the lower portion of the second via hole H2, and a bottom surface t5 of the second via hole H2. In addition, the upper edge portions of the first insulating layer 15 are not overhung, which would reduce a size of an entrance of the second via hole H2. Thus, when the second via hole H2 is to be filled with a conductive material in a later process, a void may be less likely to be generated.

Figure 17:
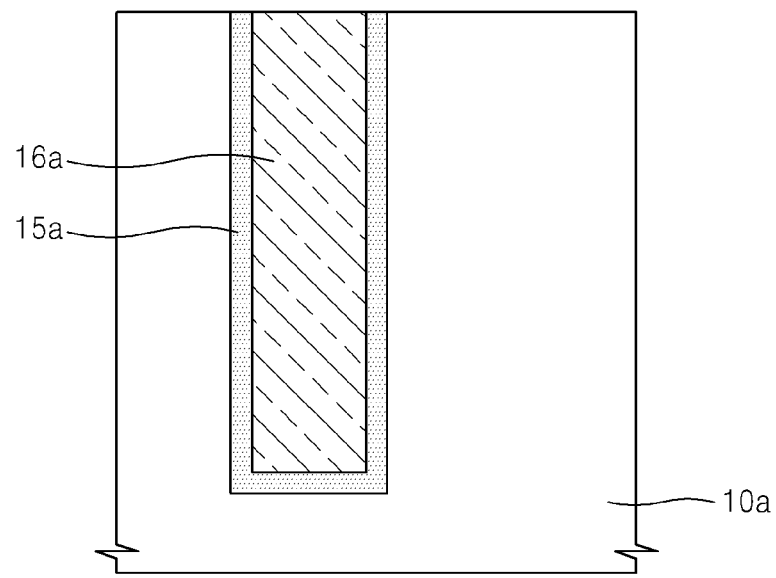

Referring to FIG. 17, the second via hole H2 in which the first insulating layer 15 is formed is filled with the conductive layer 16. The conductive layer may be a copper layer and may be formed by using an electroplating method. In this case, a seed layer (not shown) may be first formed on the first insulating layer 15. The forming of the copper layer by using an electroplating method is known in the art, and thus a detailed description thereof will be omitted here. Meanwhile, according to another example embodiment of the present invention, the conductive layer 16 may include any of various other metals or may be formed of a polysilicon.

The first insulating layer 15 and the conductive layer 16 are partially and evenly removed so as to expose the upper surface of the semiconductor substrate pattern 10a, thereby forming the first insulating layer pattern 15a and the conductive layer pattern 16a. Thus, the conductive layer pattern 16a is insulated from the semiconductor substrate pattern 10a by the first insulating layer pattern 15a.

Figure 18:
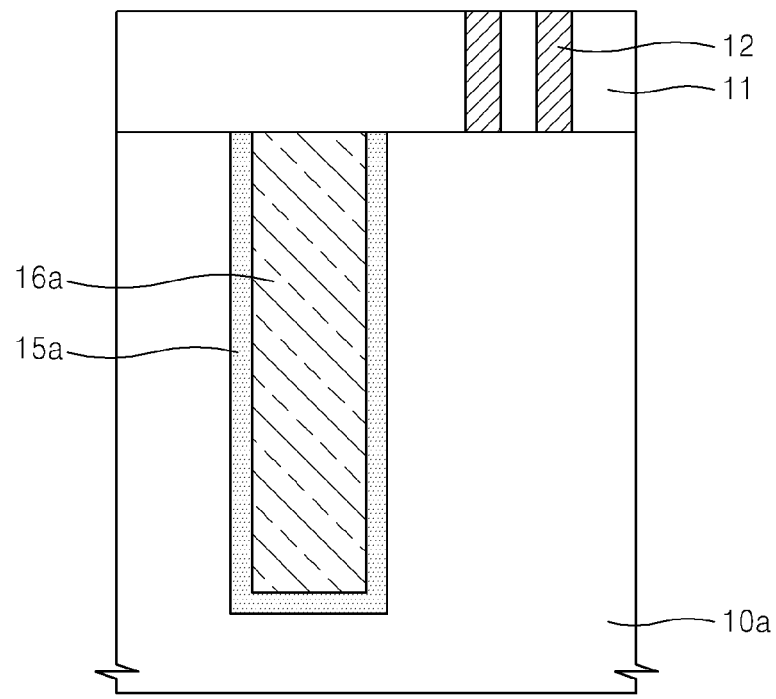

Referring to FIG. 18, the interlayer insulating layer 11 is formed on the semiconductor substrate pattern 10a, the first insulating layer pattern 15a, and the conductive layer pattern 16a. The metal wiring contacts 12 are buried in the interlayer insulating layer 11. The metal wiring contacts 12 may be connected to a first layer metal wiring pattern formed on the interlayer insulating layer 11 and may extend to the semiconductor substrate pattern 10a. The metal wiring contacts 12 extend to the semiconductor substrate pattern 10a in FIG. 18, but may extend to a gate structure, a word line structure, a bit line structure, and/or a capacitor structure when necessary.

Figure 19:
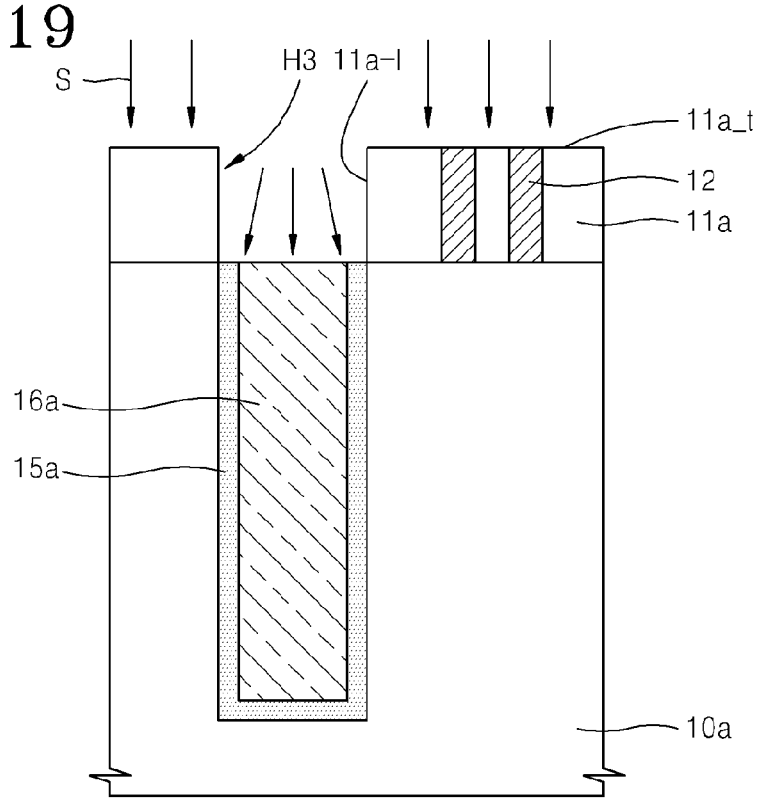

Referring to FIG. 19, the third via hole H3 is formed by etching a part of the interlayer insulating layer 11, thereby forming the insulating interlayer pattern 11a. The third via hole H3 may be formed so as to correspond to the second via hole H2. After the third via hole H3 is formed, a preprocess is performed on the insulating interlayer pattern 11a including the third via hole H3 by using the first solution S. Thus, exposed surfaces of the insulating interlayer pattern 11a, that is, the upper surfaces of the insulating interlayer pattern 11a and the side walls of the insulating interlayer pattern 11a, are changed from hydrophilic to hydrophobic.

The preprocess may include dipping the structure of FIG. 19 including the semiconductor substrate pattern 10a, the insulating interlayer pattern 11a, the first insulating layer pattern 15a, the conductive layer pattern 16a, and the third via hole H3 into the first solution S.

The first solution S may contain HF and deionized water at the ratio of 1:50 through 1:1000. In this case, a temperature of the first solution S may be about 25° C.

The first solution S may contain $H_2SO_4$, $H_2O_2$ and deionized water at the ratio of 10:4:86. The first solution S may further comprise HF with 150 to 300 ppm. In this case, a temperature of the first solution S may be about 25° C.

The first solution S may contain $NH_4OH$, $H_2O_2$ and deionized water at the ratio of 1:1:5. In this case, a temperature of the first solution S may be from about 40° C. to about 70° C.

Figure 20:
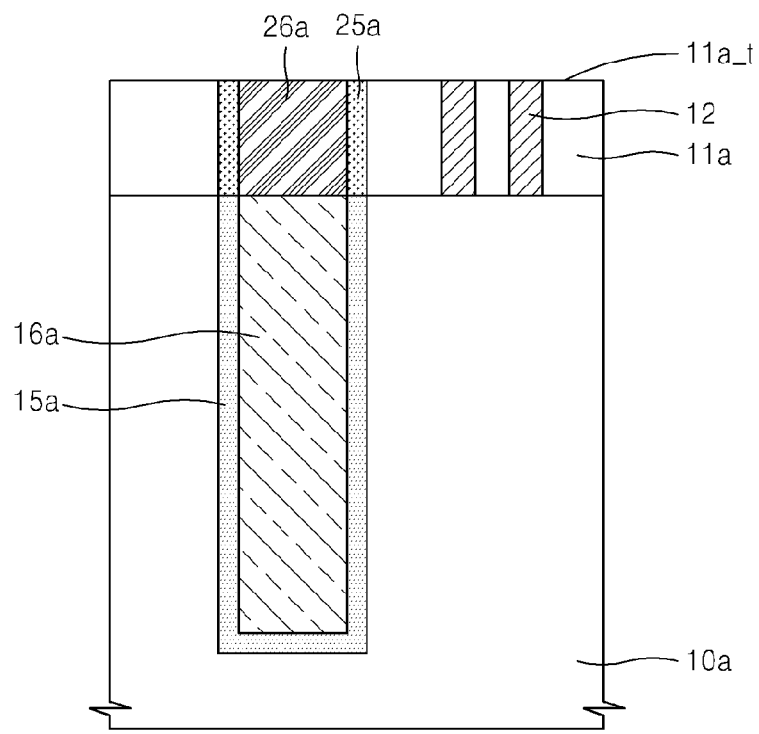

Referring to FIG. 20, a second insulating layer pattern 25a and a second conductive layer pattern 26a are formed on the side walls of the insulating interlayer pattern 11a exposed by the third via hole H3. The second insulating layer pattern 25a may be formed to extend from the first insulating layer pattern 15a, and the second conductive layer pattern 26a may be formed to extend from the conductive layer pattern 16a.

In addition, the second insulating layer pattern 25a and the first insulating layer pattern 15a may be formed of the same material, and the second conductive layer pattern 26a and the conductive layer pattern 16a may be formed of the same material.

The structure illustrated in FIG. 20 may undergo subsequent processes described with reference to FIGS. 10 through 12, thereby manufacturing a semiconductor device.

Figure 27:
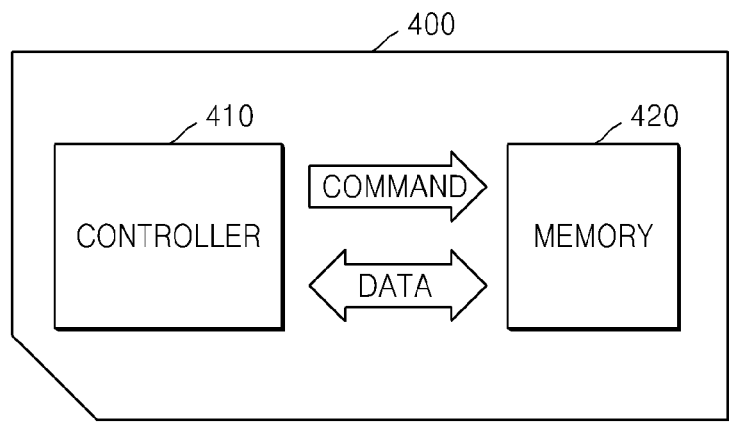
FIG. 27 is a schematic diagram illustrating a memory card including a semiconductor device, according to an example embodiment of the inventive concepts.

FIG. 27 is a schematic diagram illustrating a memory card 400 including a semiconductor device, according to an example embodiment of the inventive concepts.

The memory card 400 may include a controller 410 and a memory 420 that exchange electrical signals with each other. For example, when the controller 410 sends a command to the memory 420, the memory 420 may transmit data to the controller 410.

The memory 420 may include a semiconductor device according to an example embodiment of the inventive concepts.

The memory card 400 may be any of various kinds of memory cards, such as a memory stick card, a smart media (SM) card, a secure digital (SD) card, a mini-secure digital (SD) card, or a multimedia card (MMC).

Figure 28:
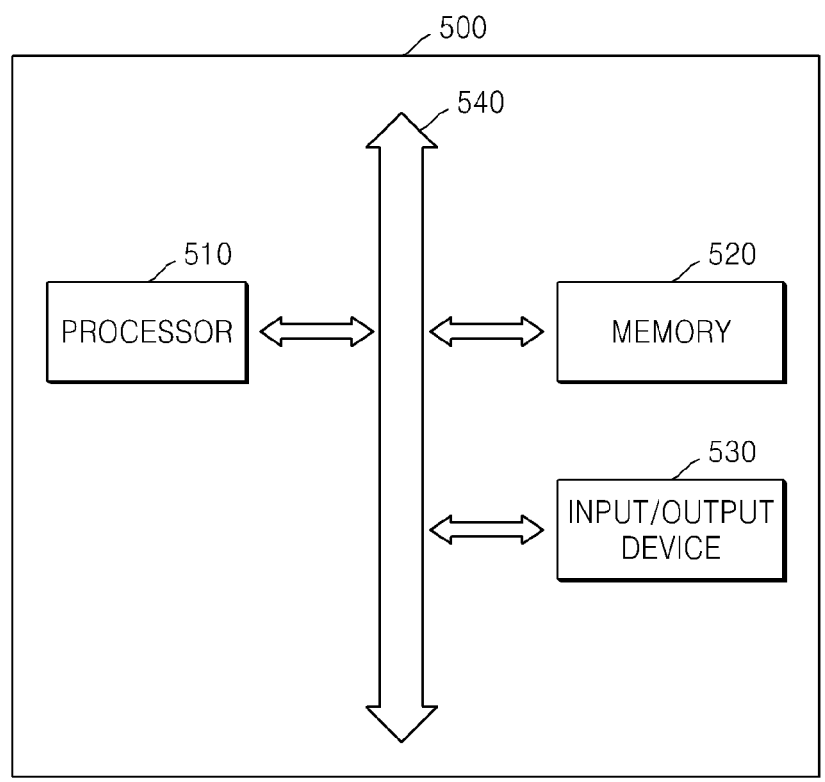
FIG. 28 is a schematic diagram illustrating a system including a semiconductor device, according to an example embodiment of the inventive concepts.

FIG. 28 is a schematic diagram illustrating a system 500 including a semiconductor device, according to an example embodiment of the inventive concepts.

The system 500 may include a processor 510, a memory 520, and an input/output device 530 that perform data communication with one another by using a bus.

The memory 520 of the system 500 may include a random access memory (RAM) and a read only memory (ROM). The system 500 may include a peripheral device 540 such as a floppy disk drive or a compact disk (CD) ROM drive.

The memory 520 may include a semiconductor device according to example embodiments of the inventive concepts. The memory 520 may store code and data for operating the processor 510. The system 500 may be used in various devices, such as a mobile phone, a navigation device, a portable multimedia player (PMP), a solid state disk (SSD), or household appliances.

While the inventive concepts have been particularly shown and described with reference to example embodiments thereof, it will be understood that various changes in form and details may be made therein without departing from the spirit and scope of the following claims.

What is claimed is:

1. A method of manufacturing a semiconductor device, the method comprising:
    forming an interlayer insulating layer on a semiconductor substrate;
    forming an insulating interlayer pattern and a semiconductor substrate pattern by sequentially etching the interlayer insulating layer and the semiconductor substrate, the insulating interlayer pattern and the semiconductor substrate pattern having a via hole exposing side walls of the insulating interlayer pattern and side walls of the semiconductor substrate pattern, and the side walls of the semiconductor substrate pattern exposed by the via hole having an impurity layer pattern;
    treating an upper surface and the side walls of the insulating interlayer pattern exposed by the via hole, the treated upper surface and side walls of the insulating interlayer pattern being hydrophobic;
    removing the impurity layer pattern from the side walls of the semiconductor substrate pattern exposed by the via hole;
    forming a first insulating layer pattern on the side walls of the semiconductor substrate pattern and the hydrophobic side walls of the insulating interlayer pattern exposed by the via hole; and
    filling a conductive layer pattern into the via hole and over the first insulating layer pattern.

2. The method of claim 1, wherein the etching of the semiconductor substrate comprises performing dry-etching on the semiconductor substrate to form the via hole, and
    the semiconductor substrate is a silicon substrate.

3. The method of claim 2, wherein the dry-etching of the silicon substrate includes,
    forming a sub-via hole exposing side walls of the silicon substrate by etching the silicon substrate using a first gas comprising fluorine;
    forming a passivation layer pattern on the side walls of the silicon substrate exposed by the sub-via hole using a second gas comprising carbon; and
    repeatedly performing the forming a sub-via hole and the forming a passivation layer pattern to form the via hole.

4. The method of claim 3, wherein the first gas comprises at least one of $SiF_4$ and $SF_6$, and the second gas comprises at least one of $C_4F_8$ and $C_4F_6$.

5. The method of claim 1, wherein the via hole is a through silicon via (TSV) hole, and the through silicon via hole has a height of about 1 μm to about 200 μm and a cross-sectional area of about 1 μm$^2$ to about 3000 μm$^2$.

6. The method of claim 1, wherein the treating and the removing collectively comprise dipping a structure including the insulating interlayer pattern, the semiconductor substrate pattern, and the impurity layer pattern into a first solution, before the forming a first insulating layer pattern.

7. The method of claim 6, wherein the first solution comprises HF and deionized water at a ratio of 1:50 through 1:1000.

8. The method of claim 6, wherein the first solution comprises HF, $H_2SO_4$, $H_2O_2$, and deionized water.

9. The method of claim 6, wherein the first solution comprises $NH_4OH$, $H_2O_2$, and deionized water.

10. The method of claim 1, wherein the impurity layer pattern comprises a polymer layer pattern including carbon.

11. A method of manufacturing a semiconductor device, the method comprising:
    forming a semiconductor substrate pattern by etching a semiconductor substrate, the semiconductor substrate pattern having a first via hole exposing side walls of the semiconductor substrate pattern, and the side walls of the semiconductor substrate pattern exposed by the first via hole having an impurity layer pattern;
    treating upper surfaces of the semiconductor substrate pattern, the treated upper surfaces of the semiconductor substrate pattern being hydrophobic;
    removing the impurity layer pattern from the side walls of the semiconductor substrate pattern exposed by the first via hole;
    forming a first insulating layer pattern on the side walls of the semiconductor substrate pattern exposed by the first via hole; and
    filling a first conductive layer pattern into the first via hole and over the first insulating layer pattern.

12. The method of claim 11, wherein
    the etching of the semiconductor substrate comprises performing dry-etching on the semiconductor substrate to form the first via hole, the semiconductor substrate being a silicon substrate, and
    the dry-etching of the silicon substrate includes,
        forming a first sub-via hole exposing side walls of the silicon substrate by etching the silicon substrate using a first gas comprising fluorine;
        forming a passivation layer pattern on the side walls of the silicon substrate exposed by the first sub-via hole using a second gas comprising carbon; and
        repeatedly performing the forming a first sub-via and the forming a passivation layer pattern to form the first via hole.

13. The method of claim 12, wherein the first gas comprises at least one of $SiF_4$ and $SF_6$, and the second gas comprises at least one of $C_4F_8$ and $C_4F_6$.

14. The method of claim 11, wherein the treating and the removing collectively comprise dipping a structure including the semiconductor substrate pattern and the impurity layer pattern into a first solution, before the forming a first insulating layer pattern.

15. The method of claim 14, wherein the first solution includes at least one of a solution containing HF and deionized water, a solution containing HF, $H_2SO_4$, $H_2O_2$, and deionized water, and a solution containing $NH_4OH$, $H_2O_2$, and deionized water.

16. The method of claim 11, wherein the impurity layer pattern comprises a polymer layer pattern including carbon.

17. The method of claim 11, further comprising, after the filling a first conductive layer pattern into the first via hole:
    forming an insulating interlayer pattern having a second via hole connected to the first via hole on the semiconductor substrate pattern, the second via hole exposing side walls of the insulating interlayer pattern;
    treating upper surfaces of the insulating interlayer pattern, the treated upper surfaces of the insulating interlayer pattern being hydrophobic; and
    filling a second conductive layer pattern into the second via hole.

18. The method of claim 17, wherein the treating comprises dipping a structure including the insulating interlayer pattern into the first solution, before the filling a second conductive layer pattern into the second via hole.

19. A method of manufacturing a semiconductor device, the method comprising:
    etching a semiconductor substrate to form a semiconductor substrate pattern having a via hole exposing side walls of the semiconductor substrate pattern, the side walls of the semiconductor substrate pattern exposed by the via hole having an impurity layer;

attaching a hydrophobic moiety to upper surfaces of the semiconductor substrate pattern;

removing the impurity layer from the side walls of the semiconductor substrate pattern exposed by the via hole;

forming an insulating layer on the side walls of the semiconductor substrate pattern; and forming a conductive layer in the via hole and over the insulating layer.

20. The method of claim 19, wherein the attaching and the removing collectively comprise exposing a structure including the semiconductor substrate pattern and the impurity layer to a solution including the hydrophobic moiety, before the forming an insulating layer.

* * * * *